(12) United States Patent
Chang et al.

(10) Patent No.: US 10,943,729 B2
(45) Date of Patent: Mar. 9, 2021

(54) ENTANGLED INDUCTOR STRUCTURES

(71) Applicant: Taiwan Semiconductor Manufacturing Co., Ltd., Hsinchu (TW)

(72) Inventors: Ka Fai Chang, Hsinchu (TW); Chin-Chou Liu, Jhubei (TW); Fong-Yuan Chang, Hsinchu (TW); Hui Yu Lee, Hsinchu (TW); Yi-Kan Cheng, Taipei (TW)

(73) Assignee: Taiwan Semiconductor Manufacturing Co., Ltd.

( * ) Notice: Subject to any disclaimer, the term of this patent is extended or adjusted under 35 U.S.C. 154(b) by 0 days.

(21) Appl. No.: 16/456,025

(22) Filed: Jun. 28, 2019

(65) Prior Publication Data

US 2020/0135388 A1 Apr. 30, 2020

Related U.S. Application Data

(60) Provisional application No. 62/753,228, filed on Oct. 31, 2018.

(51) Int. Cl.

| | |
|---|---|
| *H01L 27/08* | (2006.01) |
| *H01F 27/34* | (2006.01) |
| *H01F 27/28* | (2006.01) |
| *H01F 41/04* | (2006.01) |
| *H01L 49/02* | (2006.01) |
| *H01L 23/528* | (2006.01) |
| *H01L 23/522* | (2006.01) |

(Continued)

(52) U.S. Cl.
CPC .............. *H01F 27/34* (2013.01); *H01F 27/28* (2013.01); *H01F 41/04* (2013.01); *H01L 23/481* (2013.01); *H01L 23/5227* (2013.01); *H01L 23/5283* (2013.01); *H01L 25/0657* (2013.01); *H01L 25/50* (2013.01); *H01L 28/10* (2013.01); *H01L 2225/06541* (2013.01)

(58) Field of Classification Search
CPC .............. H01L 23/481; H01L 23/5227; H01L 23/5283; H01L 25/0657; H01F 27/34; H01F 27/28
See application file for complete search history.

(56) References Cited

U.S. PATENT DOCUMENTS

| | | | | |
|---|---|---|---|---|
| 2003/0012693 | A1* | 1/2003 | Otillar | G01N 27/745 506/39 |
| 2005/0250004 | A1* | 11/2005 | McLean | H01M 8/0289 429/122 |

(Continued)

*Primary Examiner* — Phuc T Dang
(74) *Attorney, Agent, or Firm* — Sterne, Kessler, Goldstein & Fox P.L.L.C.

(57) ABSTRACT

An entangled inductor structure generates opposite polarity internal magnetic fields therein to substantially reduce, or cancel, external magnetic fields propagating outside of the entangled inductor structure. These reduced external magnetic fields propagating outside of the entangled inductor structure effectively reduce a keep out zone (KOZ) between the entangled inductor structure and other electrical, mechanical, and/or electro-mechanical components. This allows the entangled inductor structure to be situated closer to these other electrical, mechanical, and/or electro-mechanical components within the IC as compared to conventional inductors which generate larger external magnetic fields.

16 Claims, 13 Drawing Sheets

(51) Int. Cl.
*H01L 25/00* (2006.01)
*H01L 25/065* (2006.01)
*H01L 23/48* (2006.01)

(56) References Cited

U.S. PATENT DOCUMENTS

2011/0248811 A1* 10/2011 Kireev ................ H01L 23/5227
                                                           336/200
2017/0316863 A1* 11/2017 Francis .................. H01F 27/06

* cited by examiner

ENTANGLED INDUCTOR STRUCTURES

CROSS-REFERENCE TO RELATED APPLICATIONS

The present application claims the benefit of U.S. Provisional Patent Appl. No. 62/753,228, filed Oct. 31, 2018, which is incorporated herein by reference in its entirety.

BACKGROUND

Integrated circuits (ICs) include various interconnected electrical, mechanical, and/or electro-mechanical components formed onto one or more semiconductor substrates. Often times, electronic designers of these ICs specify various keep out zones (KOZs) between these various interconnected electrical, mechanical, and/or electro-mechanical components to ensure these ICs operate as intended. For example, these various KOZs can represent minimum distances between these various interconnected electrical, mechanical, and/or electro-mechanical components to prevent electromagnetic energy produced from one of the electrical, mechanical, and/or electro-mechanical components effecting another one of the electrical, mechanical, and/or electro-mechanical components. Conventionally, the various KOZs can be quite large due to various radiated magnetic fields propagating around these various interconnected electrical, mechanical, and/or electro-mechanical components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
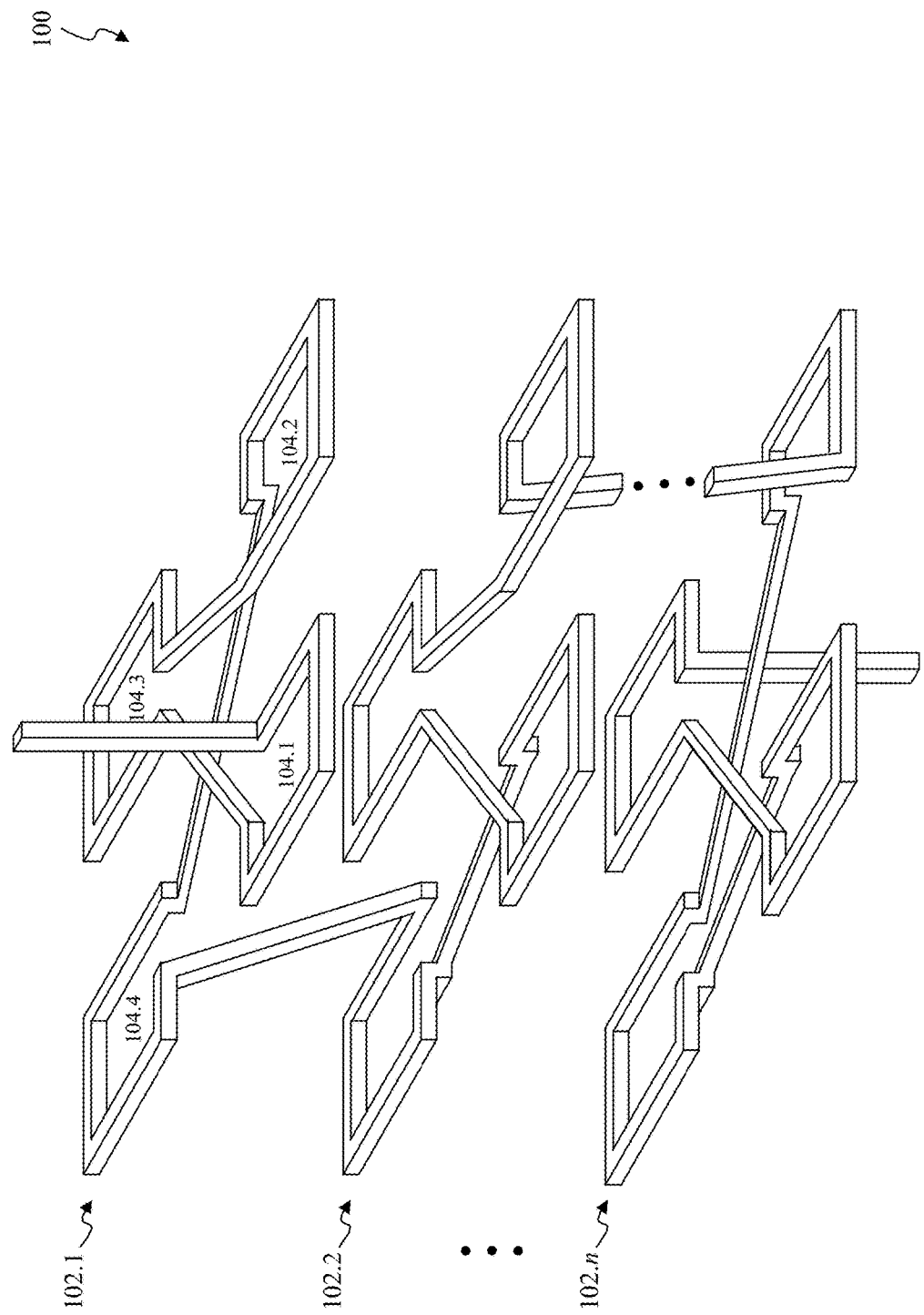
FIG. 1 illustrates a first exemplary entangled inductor structure according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations described.

Overview

An entangled inductor structure generates opposite polarity internal magnetic fields therein to substantially reduce, or cancel, external magnetic fields propagating outside of the entangled inductor structure. These reduced external magnetic fields propagating outside of the entangled inductor structure effectively reduce a keep out zone (KOZ) between the entangled inductor structure and other electrical, mechanical, and/or electro-mechanical components. This allows the entangled inductor structure to be situated closer to these other electrical, mechanical, and/or electro-mechanical components within the IC as compared to conventional inductors which generate larger external magnetic fields.

First Exemplary Entangled Inductor Structure

FIG. 1 illustrates a first exemplary entangled inductor structure according to an exemplary embodiment of the present disclosure. In the exemplary embodiment illustrated in FIG. 1, an entangled inductor structure 100 generates opposite polarity internal magnetic fields therein to substantially reduce, or cancel, external magnetic fields propagating outside of the entangled inductor structure 100 as to be discussed in further detail below. In some situations, the entangled inductor structure 100 can be situated with other electrical, mechanical, and/or electro-mechanical components, such as p-type metal-oxide-semiconductor (PMOS) transistors and/or n-type metal-oxide-semiconductor (NMOS) transistors to provide some examples, within an integrated circuit (IC). These reduced external magnetic fields propagating outside of the entangled inductor structure 100 effectively reduce a keep out zone (KOZ) between the entangled inductor structure 100 and these other electrical, mechanical, and/or electro-mechanical components. This allows the entangled inductor structure 100 to be situated closer to these other electrical, mechanical, and/or electro-mechanical components within the IC as compared to conventional inductors which generate larger external magnetic fields. In an exemplary embodiment, the KOZ between the entangled inductor structure 100 and these other electrical, mechanical, and/or electro-mechanical components can be reduced by approximately ten (10) percent as compared to the conventional KOZ.

As illustrated in FIG. 1, the entangled inductor structure 100 includes electrically interconnected entangled current carrying structures 102.1 through 102.n. In an exemplary embodiment, the entangled current carrying structures 102.1 through 102.n are situated along a vertical axis, such as a z-axis of a Cartesian coordinate system to provide an example. However, those skilled in the relevant art(s) will recognize the entangled current carrying structures 102.1 through 102.n can be situated along other axes, such as a horizontal axis, for example, an x-axis of the Cartesian coordinate system or a y-axis of the Cartesian coordinate system and/or any combination of the vertical axis and the horizontal axis, for example, along a diagonal axis of approximately forty-five (45) degrees, which will be apparent to those skilled in the relevant art(s) without departing from the spirit and scope of the present disclosure. Moreover, each of the entangled current carrying structures 102.1 through 102.n can be characterized as being situated within a logical plane, such as an x-y plane of the Cartesian coordinate system to provide an example. However, those skilled in the relevant art(s) will recognize the entangled current carrying structures 102.1 through 102.n can be situated with other planes, such as an x-z plane of the Cartesian coordinate system or a y-z plane of the Cartesian coordinate system to provide some examples, which will be apparent to those skilled in the relevant art(s) without departing from the spirit and scope of the present disclosure.

In the exemplary embodiment illustrated in FIG. 1, each of the entangled current carrying structures from among the entangled current carrying structures 102.1 through 102.n includes entangled current carrying nodes 104.1 through 104.4. However, those skilled in the relevant art(s) will recognize the entangled current carrying structures 102.1 through 102.n can include more or less entangled current carrying nodes without departing from the spirit and scope of the present disclosure. In an exemplary embodiment, each of the entangled current carrying structures 102.1 through 102.n includes a power of two (2) entangled current carrying nodes 104. As illustrated in FIG. 1, the entangled current carrying nodes 104.1 through 104.4 collectively represent a continuous electrical conductor of one or more conductive materials for carrying an electrical current. As illustrated in FIG. 1, this continuous electrical conductor is arranged to be open geometric rectangular geometric structures within the entangled current carrying nodes 104.1 through 104.4 for carrying the electrical current. However, those skilled in the relevant art(s) will recognize other open regular geometric structures, such as open circles, open ellipses, open polygons to provide some examples, and/or open irregular geometric structures such as open irregular polygons to provide an example are possible without departing from the spirit and scope of the present disclosure. The one or more conductive materials can include tungsten (W), aluminum (Al), copper (Cu), gold (Au), silver (Ag), platinum (Pt), and/or any other suitable conductive material that will be apparent to those skilled in the relevant art(s) without departing from the spirit and scope of the present disclosure. In the exemplary embodiment illustrated in FIG. 1, a first entangled current carrying node 104.1 from among the entangled current carrying nodes 104.1 through 104.4 represents an input entangled current carrying node for electrically connecting the entangled current carrying structure 102.1 to other electrical, mechanical, and/or electro-mechanical devices and/or other entangled current carrying structures from among the entangled current carrying structures 102.1 through 102.n. In this exemplary embodiment, a fourth entangled current carrying node 104.4 from among the entangled current carrying nodes 104.1 through 104.4 represents an output entangled current carrying node for electrically connecting the entangled current carrying structure 102.1 to other electrical, mechanical, and/or electro-mechanical devices and/or other entangled current carrying structures from among the entangled current carrying structures 102.1 through 102.n. However, those skilled in the relevant art(s) will recognize the input entangled current carrying node and/or the output entangled current carrying node can differ for each entangled current carrying node from among the entangled current carrying nodes 104.1 through 104.4 without departing from the spirit and scope of the present disclosure. For example, the input entangled current carrying node and/or the output entangled current carrying node are selectively chosen for each of the entangled current carrying nodes 104.1 through 104.4 to provide a continuous conductor for carrying the electrical current throughout the entangled inductor structure 100.

As to be discussed in further detail below, internal magnetic fields, those within the entangled current carrying nodes 104.1 through 104.4, generated by adjacent entangled current carrying nodes from among the entangled current carrying nodes 104.1 through 104.4 when carrying the electrical current, represent constructive magnetic fields which support each other. In contrast, external magnetic fields, those outside of the entangled current carrying nodes 104.1 through 104.4, generated by adjacent entangled current carrying nodes from among the entangled current carrying nodes 104.1 through 104.4 when carrying the electrical current, represent destructive magnetic fields which oppose each other.

Figure 2A:
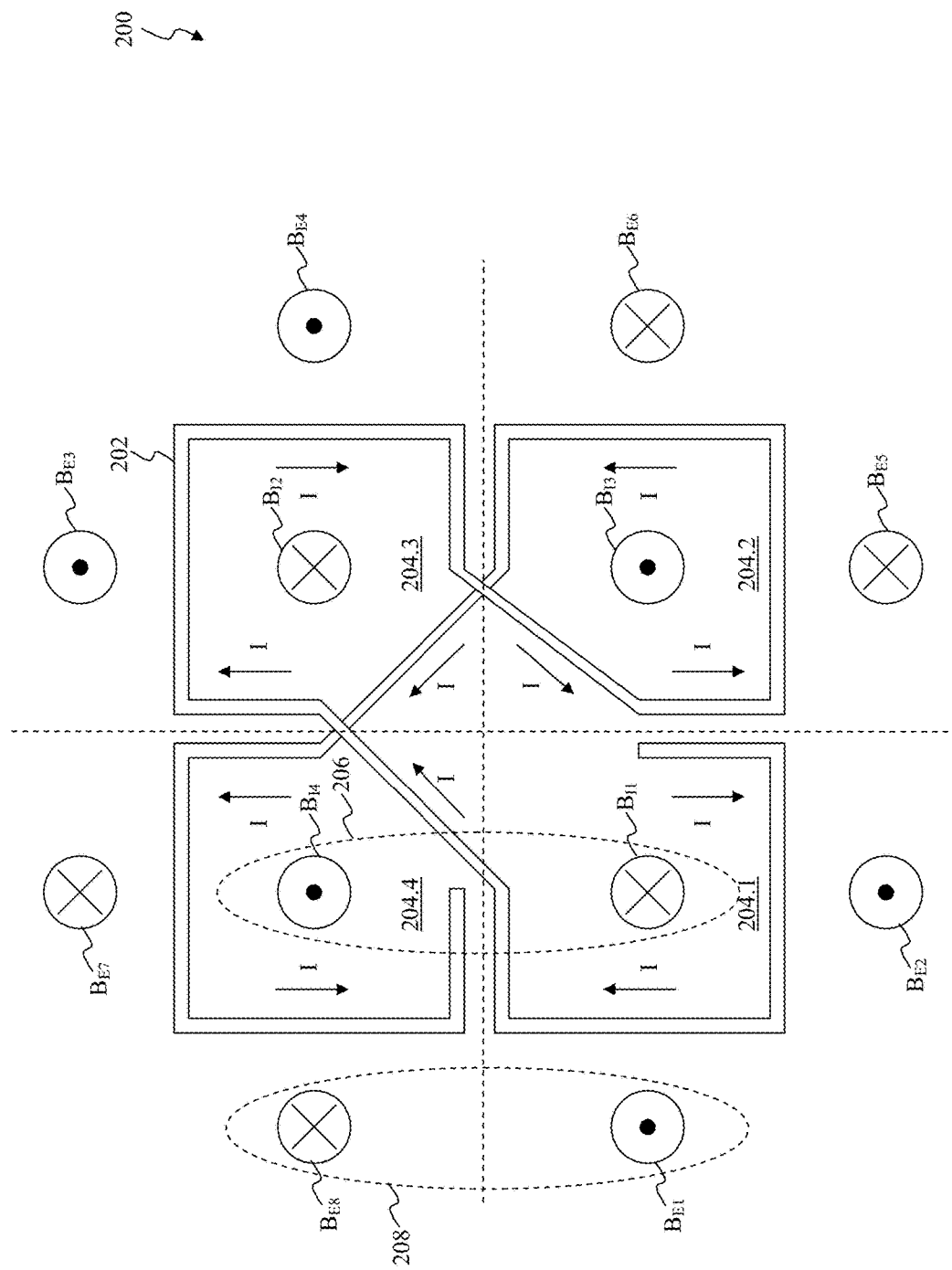
FIG. 2A and FIG. 2B graphically illustrate operation of an entangled current carrying structure within the exemplary entangled inductor structure according to an exemplary embodiment of the present disclosure.
Figure 2B:
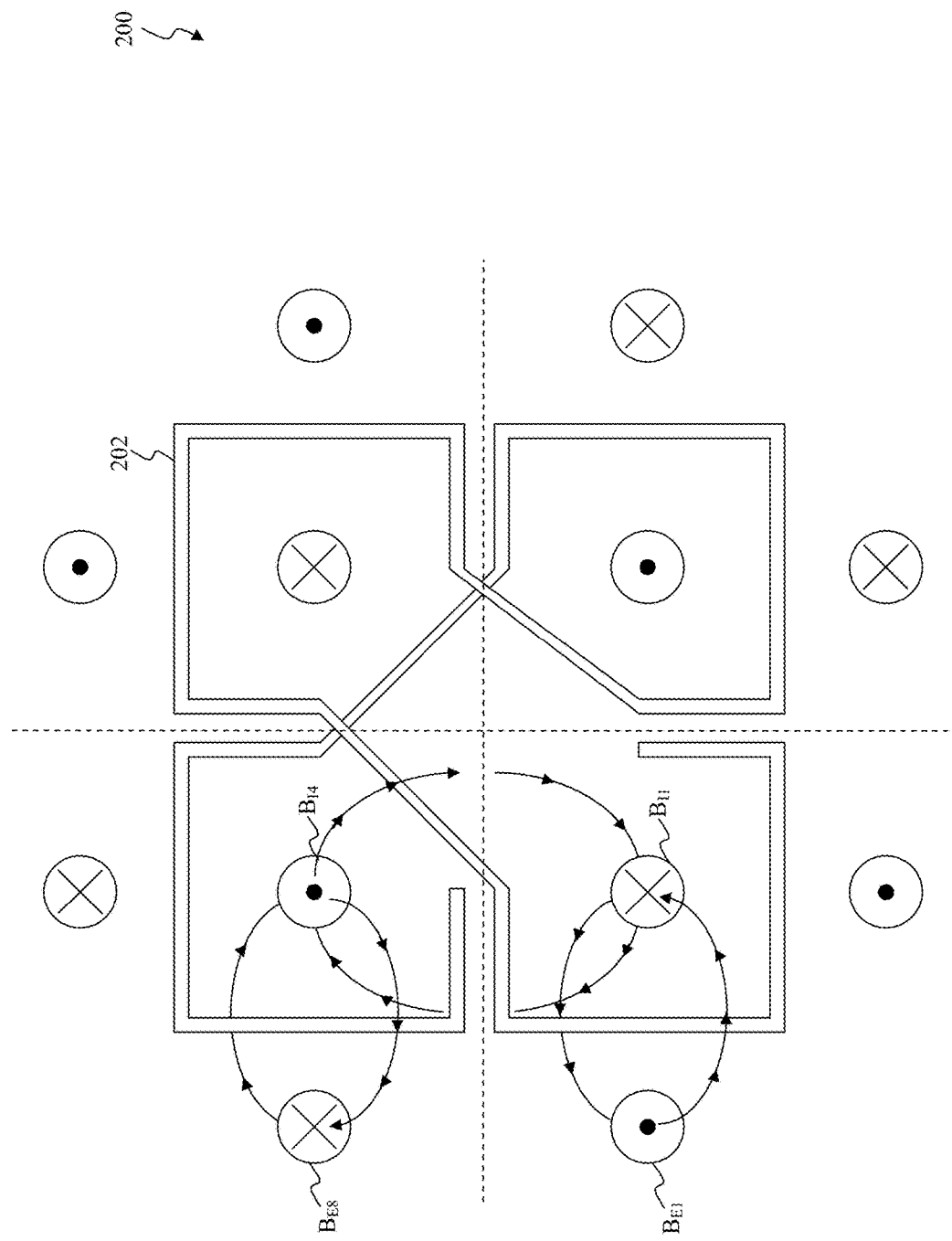

Exemplary Operation of Exemplary Entangled
Current Carrying Structures Within the Exemplary
Entangled Inductor Structure FIG. 2A and FIG. 2B graphically illustrate operation of an entangled current carrying structure within the exemplary entangled inductor structure according to an exemplary embodiment of the present disclosure. In the exemplary embodiment illustrated in FIG. 2A, an entangled current carrying structure 200 generates opposite polarity internal magnetic fields therein to substantially reduce, or cancel, external magnetic fields propagating outside of the entangled current carrying structure 200 as to be discussed in further detail below. As illustrated in FIG. 2A, the entangled current carrying structure 200 includes a continuous electrical conductor 202 of one or more conductive materials as described above for carrying an electrical current I. As illustrated in FIG. 2A, the continuous electrical conductor 202 is arranged to be open geometric rectangular geometric structures within entangled current carrying nodes 204.1 through 204.4 for carrying the electrical current. However, those skilled in the relevant art(s) will recognize other open regular geometric structures, such as open circles, open ellipses, open polygons to provide some examples, and/or open irregular geometric structures such as open irregular polygons to provide an example are possible without departing from the spirit and scope of the present disclosure.

During operation, the electrical current I enters the entangled current carrying structure 200 at the entangled current carrying node 204.1. The continuous electrical conductor 202 carries the electrical current I along the open geometric rectangular geometric structure of the entangled current carrying node 204.1 in a clockwise direction to generate a first magnetic field. This first magnetic field is characterized as including a first internal magnetic field $B_{I1}$ within the entangled current carrying node 204.1 flowing into a plane of the entangled current carrying structure 200 as shown by a circled "x" in FIG. 2A. This first magnetic field also includes first and second external magnetic fields $B_{E1}$ and $B_{E2}$ outside of the entangled current carrying node 204.1 flowing out of the plane of the entangled current carrying structure 200 as shown by a dotted circled in FIG. 2A. Next, the continuous electrical conductor 202 carries the electrical current I from the entangled current carrying node 204.1 onto the entangled current carrying node 204.3. The continuous electrical conductor 202 carries the electrical current I along the open geometric rectangular geometric structure of the entangled current carrying node 204.3 in the clockwise direction to generate a second magnetic field. This second magnetic field is characterized as including a second internal magnetic field $B_{I2}$ within the entangled current carrying node 204.2 flowing into a plane of the entangled current carrying structure 200 as shown by the circled "x" in FIG. 2A. This second magnetic field also includes third and fourth external magnetic fields $B_{E3}$ and $B_{E4}$ outside of the entangled current carrying node 204.3 flowing out of the plane of the entangled current carrying structure 200 as shown by the dotted circled in FIG. 2A. Then, the continuous electrical conductor 202 carries the electrical current I from the entangled current carrying node 204.3 onto the entangled current carrying node 204.2. The continuous electrical conductor 202 carries the electrical current I along the open geometric rectangular geometric structure of the entangled current carrying node 204.2 in a counter-clockwise direction to generate a third magnetic field. This third magnetic field is characterized as including a third internal magnetic field $B_{I3}$ within the entangled current carrying node 204.2 flowing out of the plane of the entangled current carrying structure 200 as shown by the dotted circled in FIG. 2A. This third magnetic field also includes fifth and sixth external magnetic fields $B_{E5}$ and $B_{E6}$ outside of the entangled current carrying node 204.2 flowing into the plane of the entangled current carrying structure 200 as shown by the circled "x" in FIG. 2A. Thereafter, the continuous electrical conductor 202 carries the electrical current I from the entangled current carrying node 204.2 onto the entangled current carrying node 204.4. The continuous electrical conductor 202 carries the electrical current I along the open geometric rectangular geometric structure of the entangled current carrying node 204.4 in the counter-clockwise direction to generate a fourth magnetic field. This fourth magnetic field is characterized as including a fourth internal magnetic field $B_{I4}$ within the entangled current carrying node 204.4 flowing out of the plane of the entangled current carrying structure 200 as shown by the dotted circled in FIG. 2A. This fourth magnetic field also includes seventh and eighth external magnetic fields $B_{E7}$ and $B_{E8}$ outside of the entangled current carrying node 204.4 flowing into the plane of the entangled current carrying structure 200 as shown by the circled "x" in FIG. 2A. Finally, the electrical current I exits the entangled current carrying structure 200 at the entangled current carrying node 204.4.

In the exemplary embodiment illustrated in FIG. 2A, the internal magnetic fields $B_{I1}$ through $B_{I4}$ generated by adjacent entangled current carrying nodes from among the entangled current carrying nodes 204.1 through 204.4 when carrying the electrical current, represent constructive magnetic fields which support each other. For example, as illustrated by highlighted region 206 in FIG. 2A, the first internal magnetic field $B_{I1}$ flowing into the plane of the entangled current carrying structure 200 as shown by the circled "x" supports the fourth internal magnetic field $B_{I4}$ which flows out of the plane of the entangled current carrying structure 200 as shown by the dotted circle as illustrated in FIG. 2B. In other words, the first internal magnetic field $B_{I1}$ component of the first magnetic field generated by the entangled current carrying node 204.1 flows in the same direction as the fourth internal magnetic field $B_{I4}$ component of the fourth magnetic field generated by the entangled current carrying node 204.4 as indicated by the arrows in FIG. 2B. As such, the first internal magnetic field $B_{I1}$ component of the first magnetic field and the fourth internal magnetic field $B_{I4}$ component of the fourth magnetic field represent constructive magnetic field components which support each other. In contrast, external magnetic fields $B_{E1}$ through $B_{E8}$ generated by adjacent entangled current carrying nodes from among the entangled current carrying nodes 204.1 through 204.4 when carrying the electrical current, represent destructive magnetic fields which oppose each other as illustrated in FIG. 2B. For example, as illustrated by highlighted region 208 in FIG. 2A, the first external magnetic field $B_{E1}$ flowing out of the plane of the entangled current carrying structure 200 as shown by the dotted circled opposes the eighth external magnetic field $B_{E8}$ which flows into the plane of the entangled current carrying structure 200 as shown by the circled "x" as illustrated in FIG. 2B. In other words, the first internal magnetic field $B_{I1}$ and the first external magnetic field $B_{E1}$ components of the first magnetic field generated by the entangled current carrying node 204.1 flows in the opposite direction as the fourth internal magnetic field $B_{X4}$ and the fourth external magnetic field $B_{I4}$ components of the fourth magnetic field generated by the entangled current carrying node 204.4 as indicated by the arrows in FIG. 2B. As such, the first internal magnetic field $B_{I1}$ and the fourth internal magnetic field $B_{I4}$ components of the first magnetic field and the fourth external magnetic field $B_{I4}$ components of the fourth magnetic field represent destructive magnetic fields which oppose each other. In some situations, opposing magnetic fields from among the external magnetic fields $B_{E1}$ through $B_{E8}$ generated by the adjacent entangled current carrying nodes can cancel one another which can lessen the external magnetic fields propagating outside of the entangled inductor structure 200. For example, as illustrated by the highlighted region 208 in FIG. 2A, the first external magnetic field $B_{E1}$, which opposes the eighth external magnetic field $B_{E8}$, effectively cancels the eighth external magnetic field $B_{E8}$.

Exemplary Formations of Entangled Current Carrying Structures Within the Exemplary Entangled Inductor Structure FIG. 3A through FIG. 3E graphically illustrate first exemplary operations for forming an entangled current carrying structure within the exemplary entangled inductor structure according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow for forming an entangled current carrying structure, such as one of the entangled current carrying structures 102.1 through 102.n as described above in FIG. 1 and/or the entangled current carrying structure 200 as described above in FIG. 2A.

Figure 3A:
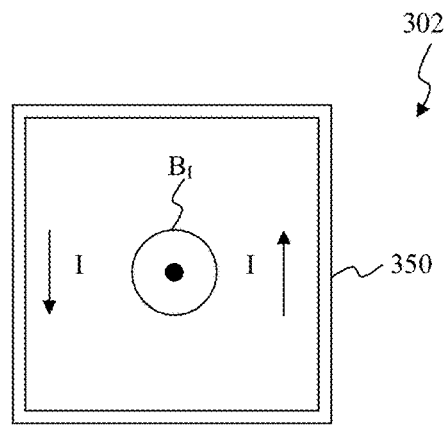
FIG. 3A through FIG. 3E graphically illustrates first exemplary operations for forming an entangled current carrying structure within the exemplary entangled inductor structure according to an exemplary embodiment of the present disclosure.

At operation 302, the exemplary operational control flow commences with an electrical conductor 350 as illustrated in FIG. 3A, such as the continuous electrical conductor 202 as described above in FIG. 2A. In the exemplary embodiment illustrated in FIG. 3A, the electrical conductor 350 is arranged to be a closed geometric structure, such as a rectangular geometric structure to provide an example. However, those skilled in the relevant art(s) will recognize other closed geometric structures, such as closed circles, closed ellipses, closed polygons to provide some examples, and/or closed irregular geometric structures such as closed irregular polygons to provide an example are possible without departing from the spirit and scope of the present disclosure. In an exemplary embodiment, the electrical conductor 350 generates a magnetic field when carrying an electrical current I along this rectangular geometric structure in the counter-clockwise direction. In this exemplary embodiment, this magnetic field includes an internal magnetic field $B_I$ which flows out of the plane of the entangled current carrying structure as shown by the dotted circle.

Figure 3B:
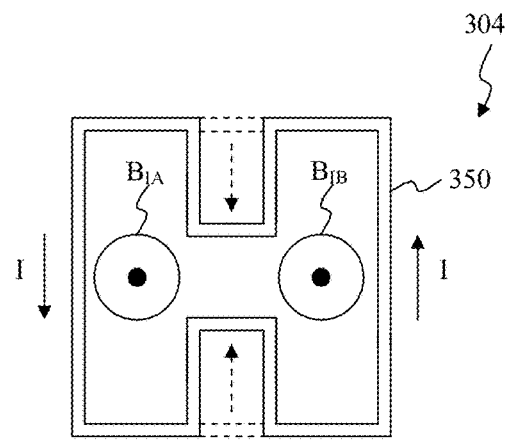

At operation 304, the exemplary operational control flow deforms the rectangular geometric structure of the electrical conductor 350 from operation 302 to effectively parse the internal magnetic field $B_I$ into a first internal magnetic field $B_{IA}$ and a second internal magnetic field $B_{IB}$ as illustrated in FIG. 3B. In an exemplary embodiment, the exemplary operational control flow displaces the electrical conductor 350 along a top and a bottom of the rectangular geometric structure of the electrical conductor towards a center of the rectangular geometric structure of the electrical conductor 350 as shown by the dashed lines and the dashed arrows in FIG. 3B. In this exemplary embodiment, the electrical conductor 350 is sufficiently displaced toward the center of the rectangular geometric structure of the electrical conductor 350 to parse the internal magnetic field $B_I$ into the first internal magnetic field $B_{IA}$ and the second internal magnetic field $B_{IB}$ as illustrated in FIG. 3B.

Figure 3C:
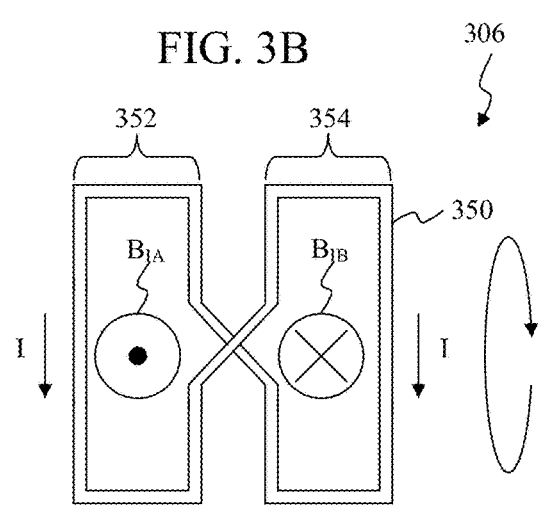

At operation 306, the exemplary operational control flow rotates the rectangular geometric structure of the electrical conductor 350 from operation 304 to effectively change a polarity of the second internal magnetic field $B_{IB}$ as illustrated in FIG. 3C. In the exemplary embodiment illustrated in FIG. 3C, the rectangular geometric structure of the electrical conductor 350 from operation 304 can be characterized as including a first region 352 which includes the first internal magnetic field $B_{IA}$ and a second region 354 which includes the second internal magnetic field $B_{IB}$. As illustrated in FIG. 3C, the second region 354 having the second internal magnetic field $B_{IB}$ is rotated approximately one hundred eighty (180) degrees to change a direction of the electrical current I flowing within the second region 354 and hence a polarity of the second internal magnetic field $B_{IB}$. This rotation changes the direction of the electrical current I flowing within the second region 354 from the clockwise direction as illustrated in FIG. 3B to be a counter-clockwise direction as illustrated in FIG. 3C. This changes the polarity of the second internal magnetic field $B_{IB}$ from flowing out of the plane of the entangled current carrying structure as shown by the dotted circle in FIG. 3B to be into the plane of the entangled current carrying structure as shown by the circled "x" in FIG. 3C.

Figure 3D:
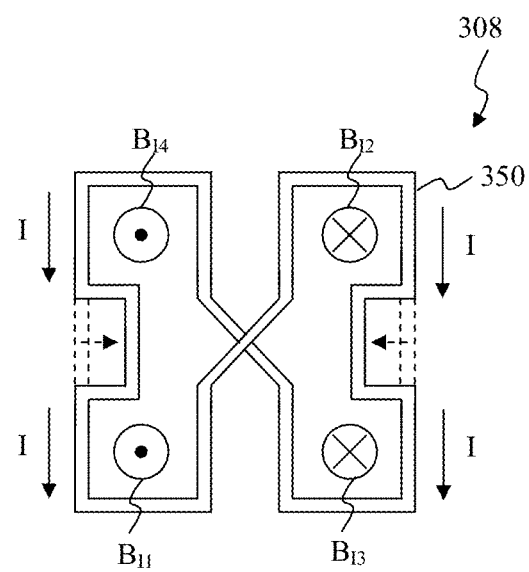

At operation 308, the exemplary operational control flow deforms the rectangular geometric structure of the electrical conductor 350 from operation 306 to effectively parse the first internal magnetic field $B_{IA}$ into the first internal magnetic field $B_{I1}$ and the fourth internal magnetic field $B_{I4}$ as described above in FIG. 2A and the second internal magnetic field $B_{IB}$ into the second internal magnetic field $B_{I2}$ and the third internal magnetic field $B_{I3}$ as described above in FIG. 2A. In an exemplary embodiment, the exemplary operational control flow displaces the electrical conductor 350 along a left and a right of the rectangular geometric structure of the electrical conductor towards a center of the rectangular geometric structure of the electrical conductor 350 as shown by the dashed lines and the dashed arrows in FIG. 3D. In this exemplary embodiment, the electrical conductor 350 is sufficiently displaced toward the center of the rectangular geometric structure of the electrical conductor 350 to parse the first internal magnetic field $B_{IA}$ into the first internal magnetic field $B_{I1}$ and the fourth internal magnetic field $B_{I4}$ and the second internal magnetic field $B_{IB}$ into the second internal magnetic field $B_{I2}$ and the third internal magnetic field $B_{I3}$ as illustrated in FIG. 3D.

Figure 3E:
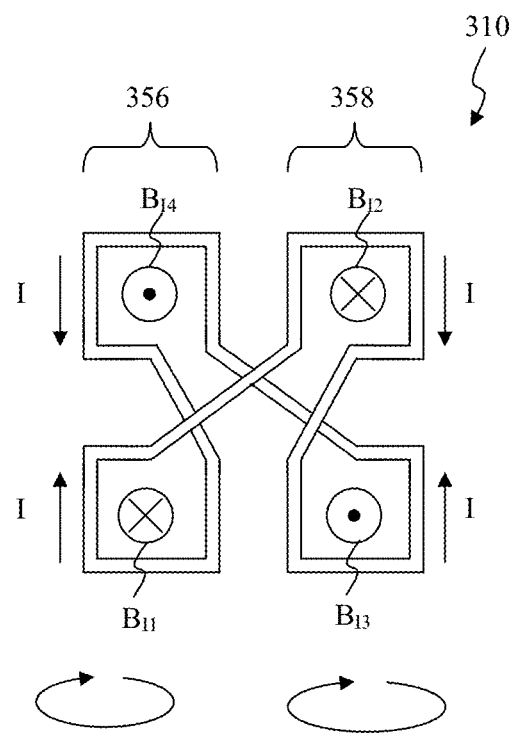

At operation 310, the exemplary operational control flow rotates the rectangular geometric structure of the electrical conductor 350 from operation 308 to effectively change a polarity of the first internal magnetic field $B_{I1}$ and the third internal magnetic field $B_{I3}$ as illustrated in FIG. 3E. In the exemplary embodiment illustrated in FIG. 3E, the rectangular geometric structure of the electrical conductor 350 from operation 308 can be characterized as including a first region 356 which includes the first internal magnetic field $B_{I1}$ and the fourth internal magnetic field $B_{I4}$ and a second region 358 which includes the second internal magnetic field $B_{I2}$ and the third internal magnetic field $B_{I3}$. As illustrated in FIG. 3E, the first region 356 which includes the first internal magnetic field $B_{I1}$ and the second region 358 which includes the third internal magnetic field $B_{I3}$ are rotated approximately one hundred eighty (180) degrees respectively to change a direction of the electrical current I flowing within the first region 356 and the second region 358 and hence both of a polarity of the first region 356 region 358 which includes the first internal magnetic field $B_{I1}$ and the second region 358 which includes the third internal magnetic field $B_{I3}$. This rotation changes the polarity of the first internal magnetic field $B_{I1}$ from flowing out of the plane of the entangled current carrying structure as shown by the dotted circle in FIG. 3D to be into the plane of the entangled current carrying structure as shown by the circled "x" in FIG. 3E and the polarity of the third internal magnetic field $B_{I3}$ from flowing into the plane of the entangled current carrying structure as shown by the circled "x" to be out of the plane of the entangled current carrying structure as shown by the dotted circle in FIG. 3E.

Although the electrical conductor 350 as described above is arranged to be a rectangular geometric structure, those skilled in the relevant art(s) will recognize the exemplary operational control flow as described above in FIG. 3A through FIG. 3E is equally applicable to form other entangled current carrying structures from any suitable closed geometric structures without departing from the spirit and scope of the present disclosure. FIG. 4A through FIG. 4E graphically illustrate second exemplary operations for forming an entangled current carrying structure within the exemplary entangled inductor structure according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow for forming an entangled current carrying structure, such as one of the entangled current carrying structures 102.1 through 102.n as described above in FIG. 1 and/or the entangled current carrying structure 200 as described above in FIG. 2A.

Figure 4A:
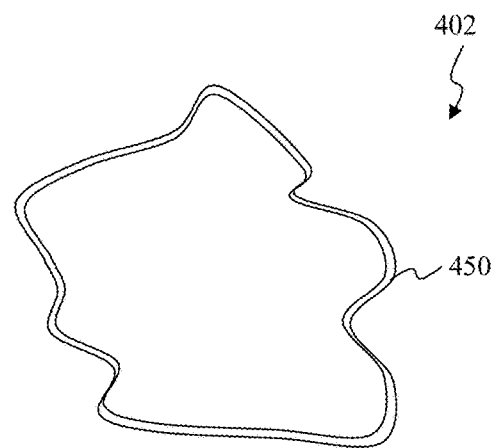
FIG. 4A through FIG. 4E graphically illustrates second exemplary operations for forming an entangled current carrying structure within the exemplary entangled inductor structure according to an exemplary embodiment of the present disclosure.

At operation 402, the exemplary operational control flow commences with an electrical conductor 450 as illustrated in FIG. 4A, such as the continuous electrical conductor 202 as described above in FIG. 2A. In the exemplary embodiment illustrated in FIG. 4A, the electrical conductor 450 is arranged to be a generic closed geometric structure.

Figure 4B:
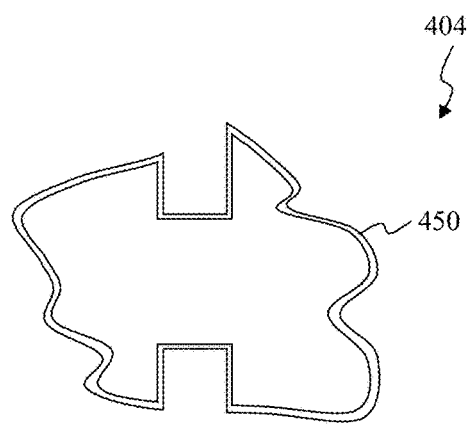

At operation 404, the exemplary operational control flow deforms the rectangular geometric structure of the electrical conductor 450 from operation 402 as illustrated in FIG. 4B. In an exemplary embodiment, the exemplary operational control flow displaces the electrical conductor 450 along a top and a bottom of the generic closed geometric structure of the electrical conductor towards a center of the generic closed geometric structure of the electrical conductor 450.

Figure 4C:
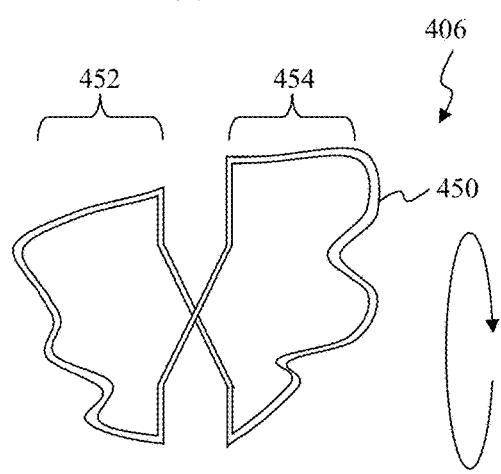

At operation 406, the exemplary operational control flow rotates the generic closed geometric structure of the electrical conductor 450 from operation 404 as illustrated in FIG. 4C. In the exemplary embodiment illustrated in FIG. 4C, the generic closed geometric structure of the electrical conductor 450 from operation 404 can be characterized as including a first region 452 and a second region 454. As illustrated in FIG. 4C, the second region 454 is rotated approximately one hundred eighty (180) degrees.

Figure 4D:
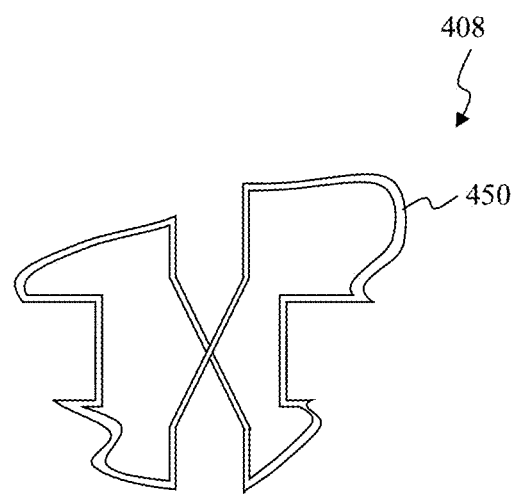

At operation 408, the exemplary operational control flow deforms the generic closed geometric structure of the electrical conductor 450 from operation 406 as illustrated in FIG. 4D. In an exemplary embodiment, the exemplary operational control flow displaces the electrical conductor 450 along a left and a right of the generic closed geometric structure of the electrical conductor towards a center of the generic closed geometric structure of the electrical conductor 450.

Figure 4E:
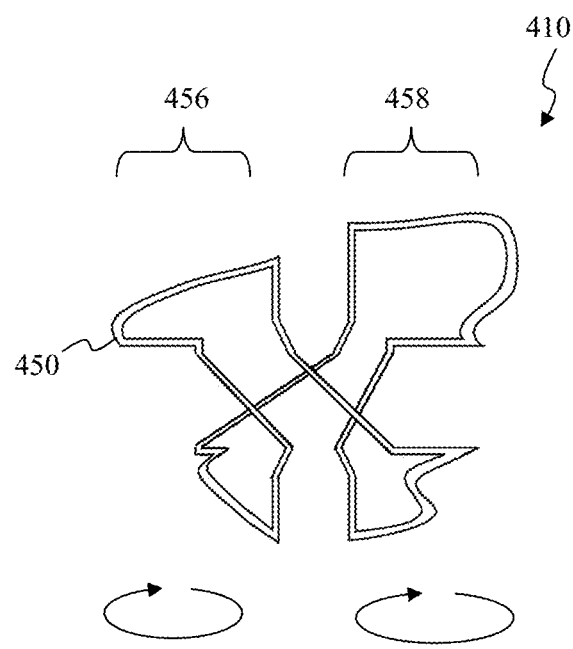

At operation 410, the exemplary operational control flow rotates the generic closed geometric structure of the electrical conductor 450 from operation 408 as illustrated in FIG. 4E. In the exemplary embodiment illustrated in FIG. 4E, the generic closed geometric structure of the electrical conductor 450 from operation 408 can be characterized as including a first region 456 and a second region 458. As illustrated in FIG. 4E, the first region 456 and the second region 458 are rotated approximately one hundred eighty (180) degrees.

Figure 5A:
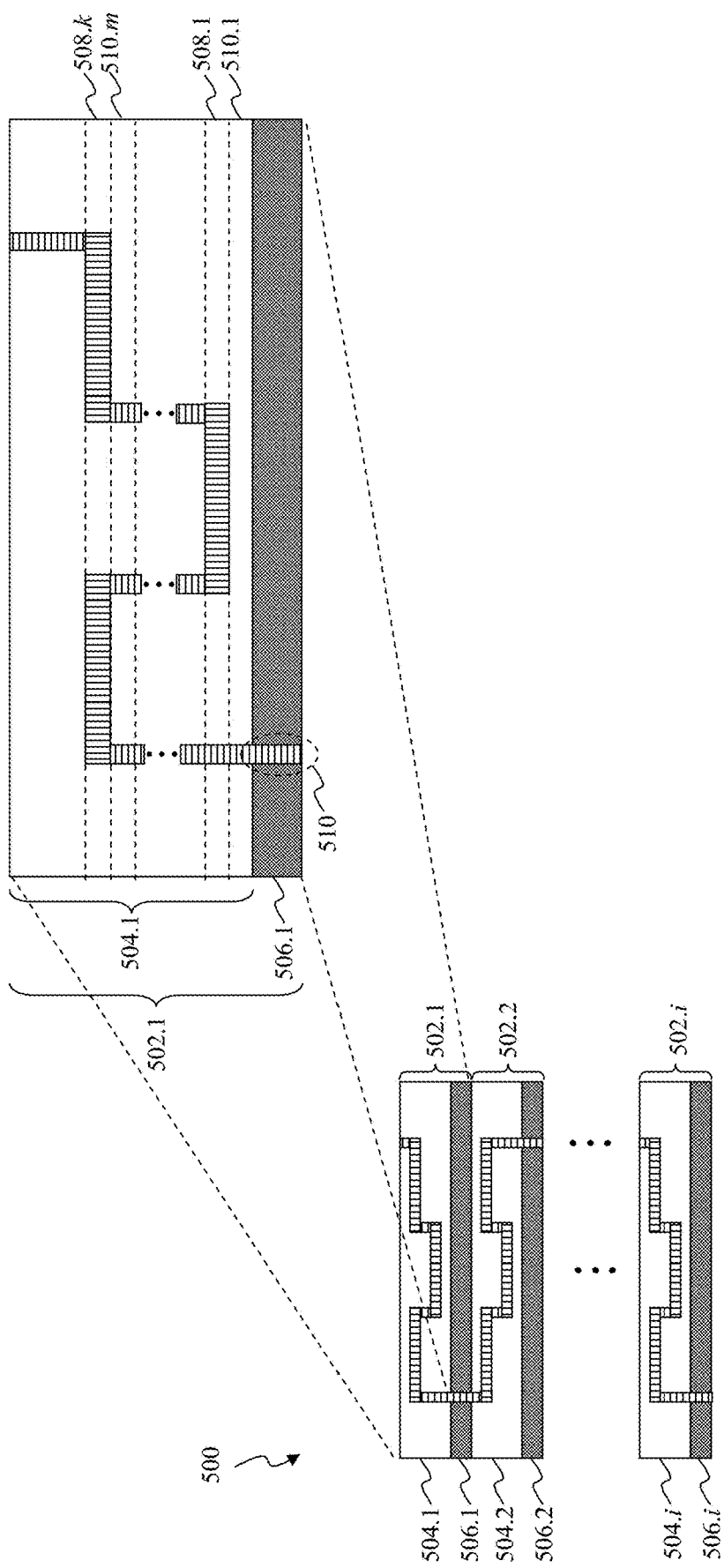
FIG. 5A illustrates a cross-sectional view of an exemplary implementation of the exemplary entangled inductor onto a semiconductor substrate according to an exemplary embodiment of the present disclosure.

Exemplary Implementation of the Entangled Inductor Structure Onto a Semiconductor Substrate FIG. 5A illustrates a cross-sectional view of an exemplary implementation of the exemplary entangled inductor onto a semiconductor substrate according to an exemplary embodiment of the present disclosure. In the exemplary embodiment illustrated in FIG. 5A, an entangled inductor structure 500 includes entangled current carrying structures, such as the entangled current carrying structures 102.1 through 102.n as described above to provide an example, implemented within semiconductor dies 502.1 through 502.i. As illustrated in FIG. 5A, the semiconductor dies 502.1 through 502.i include conductive layers 504.1 through 504.i, also referred to as metal layers. The conductive layers 504.1 through 504.i include one or more conductive materials such as tungsten (W), cobalt (Co), aluminum (Al), copper (Cu), Cu-alloys, gold (Au), silver (Ag), or platinum (Pt) to provide some examples, which are specifically arranged to implement the entangled current carrying structures as described above in FIG. 1 through FIG. 4E. Moreover, in the exemplary embodiment illustrated in FIG. 5A, the conductive layers 504.1 through 504i are situated above, for example, onto, corresponding semiconductor substrates from among semiconductor substrates 506.1 through 506.i. In an exemplary embodiment, the semiconductor substrates 506.1 through 506.i can be thin slices of semiconductor material, such as a silicon crystal, but can include other materials, or combinations of materials, such as sapphire or any other suitable material that will be apparent to those skilled in the relevant art(s) without departing from the spirit and scope of the present disclosure. As to be discussed in further detail below, the semiconductor substrates 506.1 through 506.i can include one or more through silicon via (TSV) structures to mechanically and electrically connect entangled current carrying structures situated within adjacent semiconductor dies from among the semiconductor dies 502.1 through 502.i.

In the exemplary embodiment illustrated in FIG. 5A, the semiconductor dies 502.1 through 502.i are substantially similar to one another and can slightly vary from each other depending upon the implementation of the entangled current carrying structures being utilized in the entangled inductor structure 500. As such, only the semiconductor die 502.1 is described in further in detail below. As described above, the semiconductor die 502.1 includes the conductive layer 504.1 situated above, for example, onto, the semiconductor substrate 506.1. As further illustrated in FIG. 5A, the conductive layer 504.1 includes conductive layers 508.1 through 508.k, also referred to as metal layers, interdigitated with non-conductive layers 510.1 through 510.m, also referred to as insulation layers. The conductive layers 508.1 through 508.k include the one or more conductive materials, illustrated using a horizontal shading in FIG. 5A, which are specifically arranged to implement the entangled current carrying structures as described above in FIG. 1 through FIG. 4E. The non-conductive layers 510.1 through 510.m include one or more non-conductive materials, such as silicon dioxide ($SiO_2$) or nitride ($N^{3-}$) to provide some examples, to isolate adjacent conductive layers from among the conductive layers 508.1 through 508.k. Moreover, as illustrated in FIG. 5A, the non-conductive layers 510.1 through 510.m include one or more via structures having the one or more conductive materials, illustrated using a vertical shading in FIG. 5A, to mechanically and electrically connect the one or more conductive materials situated within the conductive layers 508.1 through 508.k. Moreover, as illustrated in FIG. 5A, the semiconductor substrate 506.1 can include one or more through silicon via (TSV) structures 510 to mechanically and electrically connect the entangled current carrying structure situated within the semiconductor die 502.1 to the entangled current carrying structure situated within the semiconductor die 502.2. The one or more TSV structures 510 are mechanically and electrically connected to the entangled current carrying structure situated within the semiconductor die 502.2 using a bonding process, such as a hybrid bonding process to provide an example, to mechanically and electrically connect the entangled current carrying structure situated within the semiconductor die 502.1 to the entangled current carrying structure situated within the semiconductor die 502.2.

Figure 5B:
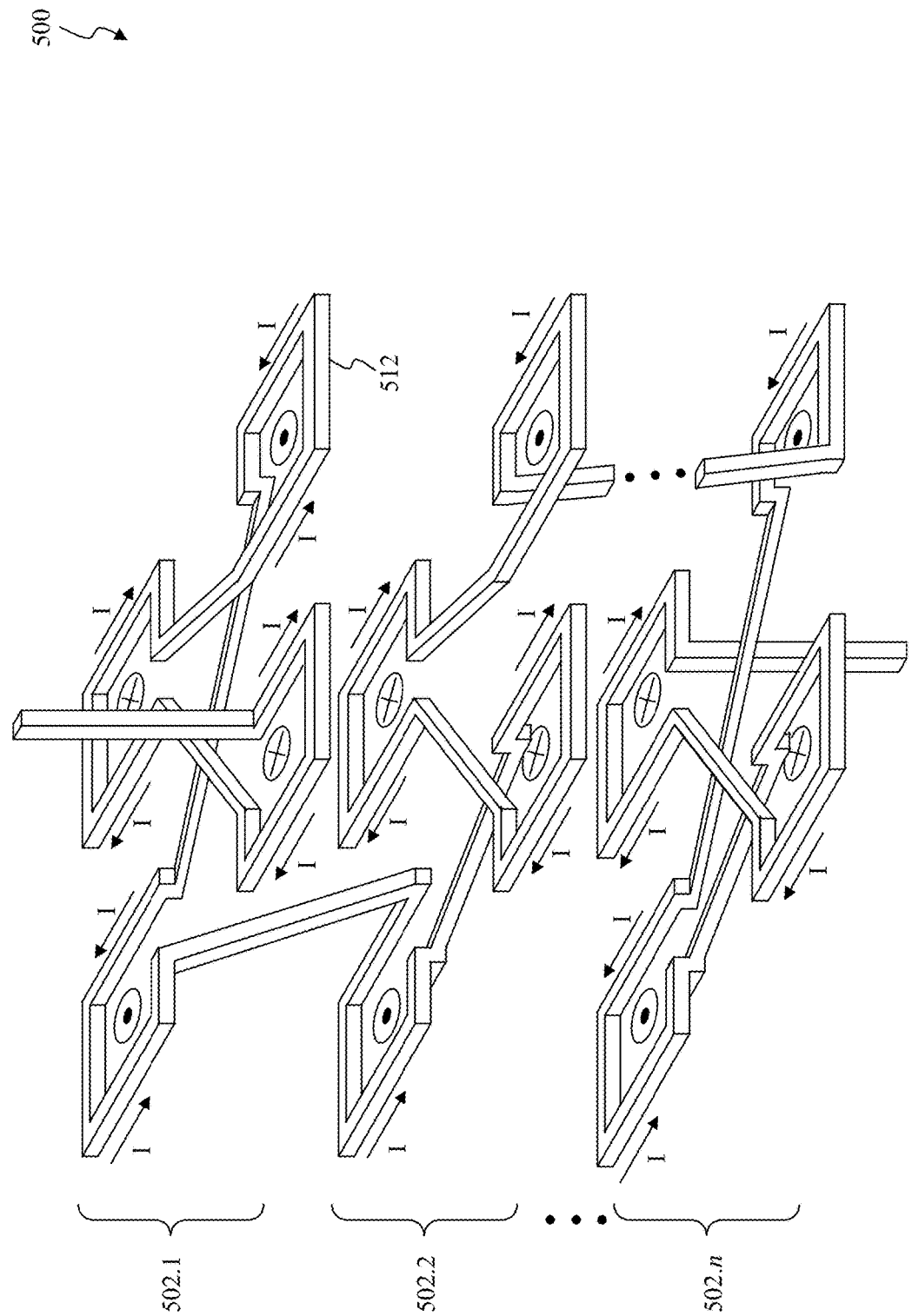
FIG. 5B graphically illustrates operation of the exemplary implementation of the exemplary entangled inductor onto the semiconductor substrate according to an exemplary embodiment of the present disclosure.

FIG. 5B graphically illustrates operation of the exemplary implementation of the exemplary entangled inductor onto the semiconductor substrate according to an exemplary embodiment of the present disclosure. Specifically. FIG. 5B illustrates operation of the entangled inductor structure 500 with the semiconductor substrates 506.1 through 506.i as illustrated in FIG. 5A not being illustrated in FIG. 5B for simplicity.

In the exemplary embodiment illustrated in FIG. 5B, an entangled current carrying structure 500 generates opposite polarity internal magnetic fields therein to substantially reduce, or cancel, external magnetic fields propagating outside of the entangled current carrying structure 500 as to be discussed in further detail below. As illustrated in FIG. 5B, the entangled current carrying structure 500 includes a continuous electrical conductor 512 of one or more conductive materials as described above for carrying an electrical current I. As illustrated in FIG. 5B, the continuous electrical conductor 512 is arranged to be open geometric rectangular geometric structures within the semiconductor dies 502.1 through 502.i for carrying the electrical current I.

During operation, the electrical current I enters the entangled current carrying structure 500 at the semiconductor die 502.1. The continuous electrical conductor 512 carries the electrical current I along the semiconductor die 502.1 to generate a first magnetic field. This first magnetic field is characterized as including internal magnetic fields within the semiconductor die 502.1 flowing into a plane of the entangled current carrying structure 500 as shown by a circled "x" in FIG. 5B and flowing out of the plane of the entangled current carrying structure 500 as shown by a dotted circled in FIG. 5B. Next, the continuous electrical conductor 512 carries the electrical current I from the semiconductor die 502.1 onto the semiconductor die 502.2. The continuous electrical conductor 512 carries the electrical current I along the semiconductor die 502.2 to generate a second magnetic field. This second magnetic field is characterized as including internal magnetic fields within the semiconductor die 502.2 flowing into a plane of the entangled current carrying structure 500 as shown by a circled "x" in FIG. 5B and flowing out of the plane of the entangled current carrying structure 500 as shown by a dotted circled in FIG. 5B. Then, the continuous electrical conductor 512 carries the electrical current I from the semiconductor die 502.2 onto the semiconductor die 502.n. The continuous electrical conductor 512 carries the electrical current I along the semiconductor die 502.n to generate an $n^{th}$ magnetic field. This $n^{th}$ magnetic field is characterized as including internal magnetic fields within the semiconductor die 502.n flowing into a plane of the entangled current carrying structure 500 as shown by a circled "x" in FIG. 5B and flowing out of the plane of the entangled current carrying structure 500 as shown by a dotted circled in FIG. 5B.

Second Exemplary Entangled Inductor Structure

Figure 6A:
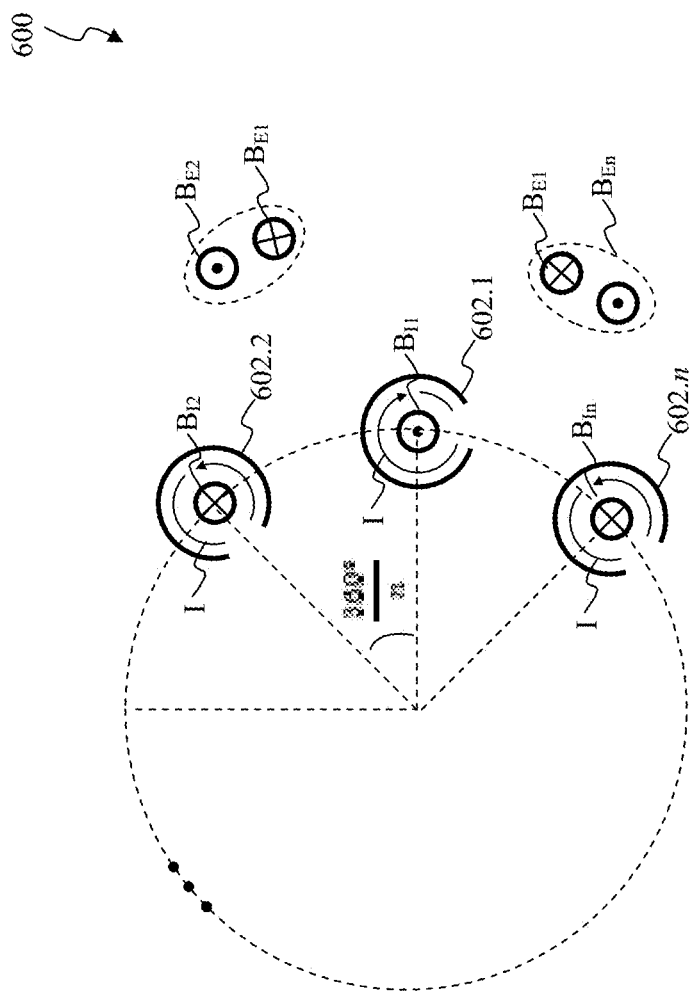
FIGS. 6A and 6B illustrate a second exemplary entangled inductor structure according to an exemplary embodiment of the present disclosure.
Figure 6B:
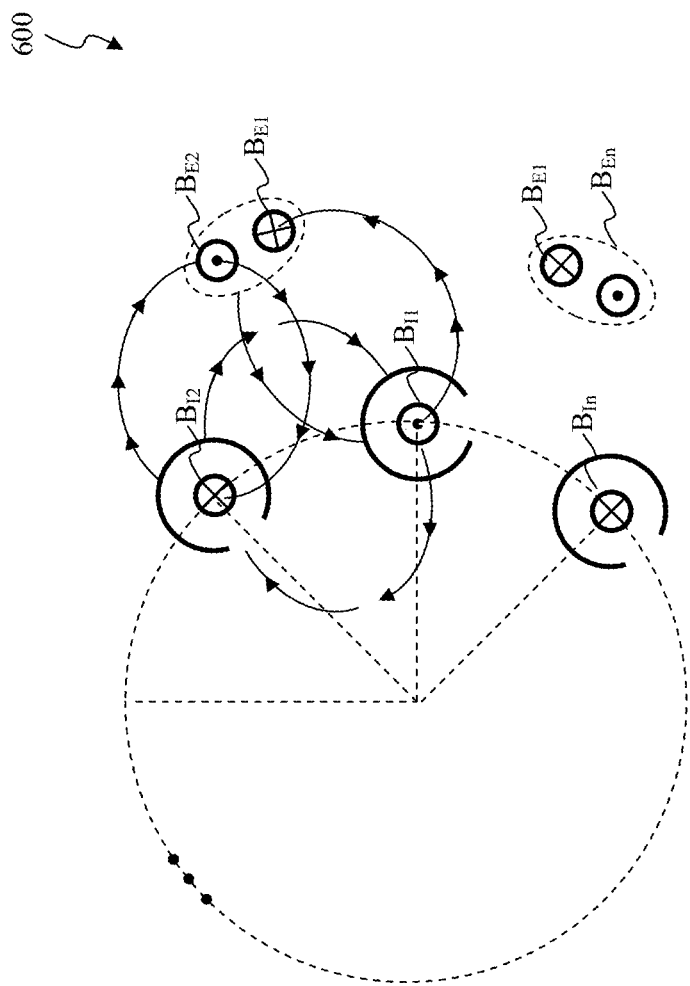

FIG. 6A and FIG. 6B illustrate a second exemplary entangled inductor structure according to an exemplary embodiment of the present disclosure. In the exemplary embodiment illustrated in FIG. 6A, an entangled inductor structure 600 generates opposite polarity internal magnetic fields therein to substantially reduce, or cancel, external magnetic fields propagating outside of the entangled inductor structure 600 in a substantially similar manner as the entangled inductor structure 100 as described above in FIG. 1. The entangled inductor structure 100 as described above in FIG. 1 represents an entangled inductor structure having four phases represented by the entangled current carrying nodes 104.1 through 104.4. The entangled inductor structure 600 as to be described in further detail below, represents an entangled inductor structure having one or more electrically interconnected entangled current carrying structures. As illustrated in FIG. 6A, each of the entangled current carrying structures can be characterized as having n-phases represented by entangled current carrying nodes 602.1 through 602.n. In an exemplary embodiment, each of the entangled current carrying structures of the entangled inductor structure 600 is implemented as an eight-phase entangled inductor structure having entangled current carrying nodes 602.1 through 602.8. In this exemplary embodiment, each of the entangled current carrying nodes 602.1 through 602.8 can be arranged to form an inductor and/or two or more of the entangled current carrying nodes 602.1 through 602.8 can be interconnected to form an inductor. In some situations, the entangled inductor structure 600 can be situated with other electrical, mechanical, and/or electro-mechanical components, such as p-type metal-oxide-semiconductor (PMOS) transistors and/or n-type metal-oxide-semiconductor (NMOS) transistors to provide some examples, within an integrated circuit (IC). These reduced external magnetic fields propagating outside of the entangled inductor structure 600 effectively reduce a keep out zone (KOZ) between the entangled inductor structure 600 and these other electrical, mechanical, and/or electro-mechanical components in as substantially similar manner as the entangled inductor structure 100 as described above in FIG. 1.

As described above, each of the entangled current carrying structures of the entangled inductor structure 600 includes the electrically interconnected entangled current carrying nodes 602.1 through 602.n. In the exemplary embodiment, the entangled current carrying nodes 602.1 through 602.n can be implemented using any of the entangled current carrying nodes as described above in FIG. 1 through FIG. 5A to form each of the entangled current carrying structures of the entangled inductor structure 600 having the n-phases. In an exemplary embodiment, the entangled current carrying nodes 602.1 through 602.n have substantially similar arrangements. As illustrated in FIG. 6A, the entangled current carrying nodes 602.1 through 602.n are arranged in a circular configuration and separated from each other, along the circular configuration, by:

$$\frac{360°}{n} \qquad (1)$$

In the exemplary embodiment illustrated in FIG. 6A, internal magnetic fields, those within the entangled current carrying nodes 602.1 through 602.n, generated by adjacent entangled current carrying nodes from among the entangled current carrying nodes 602.1 through 602.n when carrying the electrical current, represent constructive magnetic fields which support each other. In contrast, external magnetic fields, those outside of the entangled current carrying nodes 602.1 through 602.n, generated by adjacent entangled current carrying nodes from among the entangled current carrying nodes 602.1 through 602.n when carrying the electrical current, represent destructive magnetic fields which oppose each other. In some situations, the external magnetic fields generated by the adjacent entangled current carrying nodes can cancel one another which can lessen the external magnetic fields propagating outside of the entangled inductor structure 600.

During operation, the electrical current I enters the entangled current carrying structure 600 at the entangled current carrying node 602.1. The entangled current carrying node 602.1 carries the electrical current I in a clockwise direction to generate a first magnetic field. This first magnetic field is characterized as including a first internal magnetic field $B_{I1}$ within the entangled current carrying node 602.1 flowing out of a plane of the entangled current carrying structure 600 as shown by a dotted circle in FIG. 6A. This first magnetic field also includes a first external magnetic fields $B_{E1}$ outside of the entangled current carrying node 602.1 flowing into the plane of the entangled current carrying structure 600 as shown by circled "x" in FIG. 6A. Next, the carrying node 602.2 carries the electrical current I from the entangled current carrying node 602.1 along the entangled current carrying node 602.3 in the counter-clockwise direction to generate a second magnetic field. This second magnetic field is characterized as including a second internal magnetic field $B_{I2}$ within the entangled current carrying node 602.3 flowing out a plane of the entangled current carrying structure 600 as shown by the dotted circle in FIG. 6A. This second magnetic field also includes a second external magnetic fields $B_{E2}$ outside of the entangled current carrying node 602.2 flowing into of the plane of the entangled current carrying structure 600 as shown by the circled "x" in FIG. 6A. The entangled current carrying nodes 602.3 through 602.n similarly carry the electrical current I in a clockwise direction or a counter-clockwise direction to generate various internal and external magnetic fields as illustrated in FIG. 6A.

In the exemplary embodiment illustrated in FIG. 6A, the internal magnetic fields $B_{I1}$ through $B_{In}$ generated by adjacent entangled current carrying nodes from among the entangled current carrying nodes 602.1 through 602.n when carrying the electrical current, represent constructive magnetic fields which support each other as illustrated in FIG. 6B. For example, as illustrated in FIG. 6A and FIG. 6B, the first internal magnetic field $B_{I1}$ flowing out of the plane of the entangled current carrying structure 600 as shown by the dotted circle supports the second internal magnetic field $B_{I2}$ which flows into the plane of the entangled current carrying structure 600 as shown by the circled "x". In contrast, external magnetic fields $B_{E1}$ through $B_{En}$ generated by adjacent entangled current carrying nodes from among the entangled current carrying nodes 602.1 through 602.n when carrying the electrical current, represent destructive magnetic fields which oppose each other as illustrated in FIG. 6B. For example, the first external magnetic field $B_{E1}$ flowing into the plane of the entangled current carrying structure 600 as shown by the circled "x" opposes the second external magnetic field $B_{E2}$ which flows out of the plane of the entangled current carrying structure 600 as shown by the dotted circle as illustrated in FIG. 6B. In some situations, opposing magnetic fields the external magnetic fields $B_{E1}$ through $B_{En}$ generated by the adjacent entangled current carrying nodes can cancel one another which can lessen the external magnetic fields propagating outside of the entangled inductor structure 600. For example, the first external magnetic field $B_{E1}$, which opposes the second external magnetic field $B_{E2}$, effectively cancels the second external magnetic field $B_{E2}$.

Application for the Exemplary Entangled Inductor Structures

Figure 7:
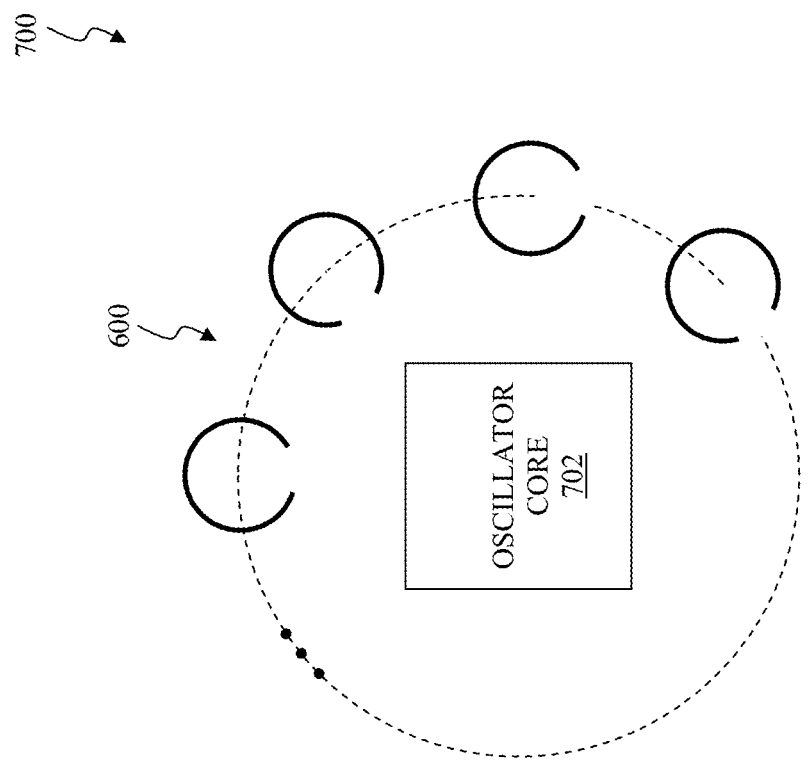
FIG. 7 illustrates a block diagram of voltage-controlled oscillator circuitry having the exemplary entangled inductor structure according to an exemplary embodiment of the present disclosure.

FIG. 7 illustrates a block diagram of voltage-controlled oscillator circuitry having the exemplary entangled inductor structure according to an exemplary embodiment of the present disclosure. In the exemplary embodiment illustrated in FIG. 7, voltage-controlled oscillator circuitry 700 represents an electronic circuit which generates a periodically oscillating electronic signal such as a sinusoidal waveform or a sawtooth waveform to provide some examples, whose characteristics, such as phase and/or frequency to provide some examples, are dependent upon an electronic voltage. In an exemplary embodiment, the voltage-controlled oscillator circuitry 700 can be arranged to be a linear or harmonic oscillator for generating the sinusoidal waveform. A voltage-controlled oscillator can include one or more resonant circuits which are specially arranged to provide the sinusoidal waveform. These resonant circuits can include one or more inductors and/or one or more resistors and/or capacitors to provide some examples. In the exemplary embodiment illustrated in FIG. 7, multiple voltage-controlled oscillators can be configured and arranged to form the voltage-controlled oscillator circuitry 700. In an exemplary embodiment, two voltage-controlled oscillators can be configured and arranged to form a quadrature voltage-controlled oscillator. As illustrated in FIG. 7, the inductors of the multiple voltage-controlled oscillators can be implemented using the entangled current carrying nodes 602.1 through 602.n of the entangled inductor structure 600 as described in FIG. 6A with the other components of the multiple voltage-controlled oscillators being arranged to form the oscillator core 702.

Exemplary Fabrication of the Exemplary Entangled Inductor Structures

Figure 8:
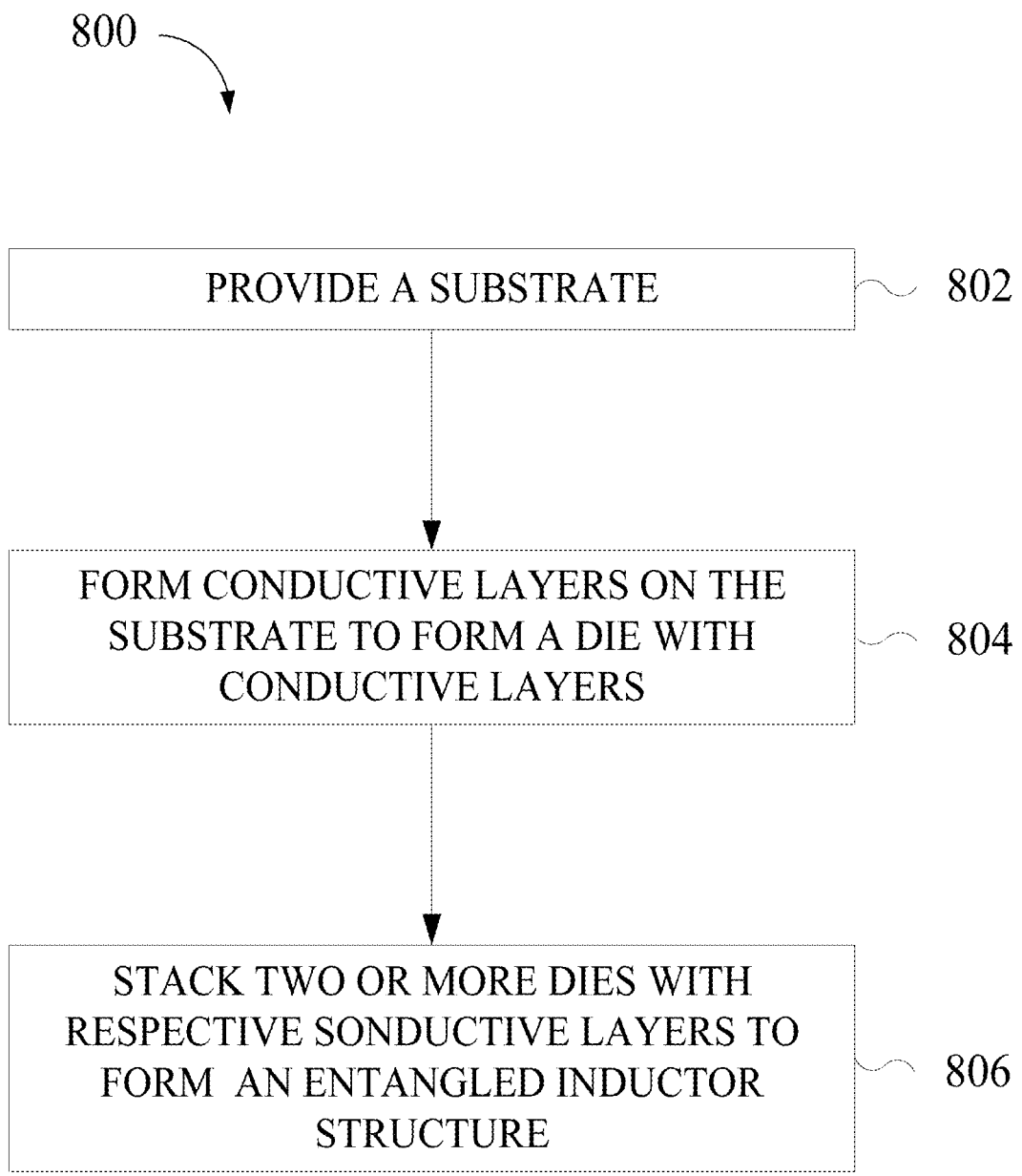
FIG. 8 illustrates a flowchart of exemplary operations for fabricating the exemplary entangled inductor structures according to an exemplary embodiment of the present disclosure.

FIG. 8 illustrates a flowchart of exemplary operations for fabricating the exemplary entangled inductor structures according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 800 for fabricating an entangled inductor structure, such as the entangled inductor structure 100 and/or the entangled inductor structure 600 to provide some examples.

Referring to FIG. 8, operational control flow 800 begins with operation 802, where a substrate is provided as a foundation for the formation of the conductive layers in a die. As discussed earlier, the substrate can include a semiconductor material, such as for example silicon, or other materials, such as for example sapphire ($Al_2O_3$). By way of example and not limitation, operational control flow 800 will be described in the context of a semiconductor substrate, like silicon (e.g., single crystal). Based on the disclosure herein, other materials, as discussed above, can be used. These materials are within the spirit and scope of this disclosure. In some embodiments, the substrate of operation 802 is similar to semiconductor substrate 506.1 shown in FIG. 5A. In some embodiments, the semiconductor substrate is thinned to facilitate the formation of the TSVs.

By way of example and not limitation, TSVs openings can be formed in predetermined locations in semiconductor substrate 506.1 to provide electrical and mechanical connections to dies attached below semiconductor substrate 506.1. TSVs can be formed with a patterning process, during which a photoresist is applied (e.g., spin coated) on semiconductor substrate 506.1. The photoresist can be subsequently patterned, according to a desired layout, to form openings in the photoresist that expose areas of semiconductor substrate 506.1. These exposed areas on semiconductor substrate 506.1 define the locations where the TSVs will be formed. Using the patterned photoresist as an etching mask, an anisotropic etching process (e.g., a dry etching) can form respective TSV openings with substantially vertical sidewalls in the exposed areas of the semiconductor substrate 506.1. The TSV openings can be later filled with a conductive material, such as a metal or a metal alloy, to form TSVs structures, like TSV 510 shown in FIG. 5A. Depending on the integration scheme, TSVs 510 can be formed either before or after the formation of the conductive layers on the semiconductor substrate. Regardless when the TSVs are formed, the formation process can be similar to the one described above. It is noted, that other formation processes may be used to form TSVs 510. These other formation processes are within the spirit and scope of this disclosure.

In some embodiments, a bump, such as a solder bump, can be formed on the bottom end of the TSV (e.g., on the surface of the semiconductor substrate that interfaces with the underlying die, thereafter referred to as a "backside surface of the semiconductor substrate") to serve as a contact point or anchor point for the connection between the semiconductor substrate and the underlying die. By way of example and not limitation, a bump can be formed on a dielectric that has been deposited on the backside surface of the wafer. In some embodiments a under bump metallurgy (UBM) is formed prior to the formation of the bump to increase the contact area and lower the resistance of the connection. Thus, the TSV in the semiconductor substrate is connected to the UBM and the bump on the backside surface of the semiconductor substrate.

Operational control flow 800 continues to operation 804, where conductive layers, such as conductive layers 504.1 shown in FIG. 5A, are formed on semiconductor substrate 506.2. In some embodiments, the conductive layers formed in operation 804 are back end of the line (BEOL) metallization layers that include, but are not limited to, one or more lateral conductive structures (e.g., entangled current carrying structures) connected through vertical conductive structures (e.g., vias) embedded in a dielectric layer. In some embodiments, the dielectric layer is a low-k dielectric (e.g., with a dielectric constant lower than 3.9) or a stack of dielectrics, such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; or (iv) a low-k dielectric (e.g., carbon doped silicon oxide) with silicon oxide. By way of example and not limitation, the dielectric layer can be deposited by a high-density chemical vapor deposition (HDCVD) process, a plasma-enhanced chemical vapor deposition process (PECVD), a plasma-enhanced atomic layer deposition process (PEALD), or any other suitable deposition method. In some embodiments, the vias and the entangled current carrying structures can be formed successively or together. For example, using photolithography and etching operations, the openings for the vias and the entangled current carrying structures can be formed in the dielectric layer successively or concurrently. By way of example and not limitation, the openings for the vias and the entangled current carrying structures can be filed with a conductive material in a single operation (e.g., with a dual damascene process) or in separate operations.

In some embodiments, if a stack of entangled current carrying structures is desired within each conductive layer 504.1, each entangled current carrying structure (along with its corresponding via) can be formed in a dielectric "sub-layer". For example, a first dielectric layer can be deposited on the semiconductor substrate. Openings for the first entangled current carrying structure and the first via can be formed in the first dielectric. In some embodiments, the first via opening can be aligned to the TSV in the semiconductor substrate. The openings are subsequently filled with a metal or metal alloy to complete the first via and first entangled current carrying structure formation. A chemical mechanical planarization (CMP) process can remove the metal or the metal alloy that has been deposited on the top surface of the first dielectric layer as a result of the deposition process. The aforementioned operations complete the formation of the first sub-layer. A second dielectric can be deposited on the first dielectric. Openings for the second entangled current carrying structure and the second via can be formed within the second dielectric. In some embodiments, the second via opening exposes a portion of the first entangled current carrying structure according to a desired layout design. Thereafter, the openings are filled with a metal or metal alloy and a CMP process removes the excess metal or the metal alloy from the top surface of the second dielectric. The aforementioned operations complete the formation of the second sub-layer. These operations can be repeated as necessary until all the entangled current carrying structures are formed within the conductive layer. Once all the entangled current carrying structures are formed, a final via is formed on the top entangled current carrying structure of the conductive layer, and a pad structure is formed over the final via. The pad structure is a large conductive structure (e.g., larger than the final via) that serves as a connection point for a die that will be disposed on the formed conductive layer.

In some embodiments, the substrate with the one or more entangled current carrying structures forms a die. Multiple dies with one or more entangled current carrying structures can be stacked vertically to form an entangled conductive structure.

Referring to FIG. 8, Operational control flow 800 continues with operation 804, where two or more dies with one or more entangled current carrying structures are stacked vertically to form an entangled conductive structure as shown in FIG. 5A. In some embodiments the TSVs of the top die, through the bump on the backside surface of the semiconductor substrate, are connected to the pad structure of the underlying die (e.g., bottom die). In some embodiments, the dies are bonded together through, for example, a hybrid bonding between the bumps of the top die and the pad structures of the bottom die. Consequently, an entangled inductor structure with any desired number of entangled conductive structures can be formed, according to some embodiments.

CONCLUSION

The foregoing Detailed Description discloses an entangled current carrying structure of an entangled inductor structure. The entangled current carrying structure includes first through fourth entangled current carrying nodes. The first through fourth entangled current carrying nodes are electrically interconnected to one another to form a first continuous electrical conductor for carrying an electrical current. And adjacent external magnetic fields from multiple external magnetic fields generated by adjacent entangled current carrying nodes from the entangled current carrying nodes in response to carrying the current cancel each other.

The foregoing Detailed Description additionally discloses an entangled inductor structure. The entangled inductor structure includes a first semiconductor substrate having a first entangled current carrying structure from entangled current carrying structures, the first entangled current carrying structure including first entangled current carrying nodes. The entangled inductor structure also includes a second semiconductor substrate having a second entangled current carrying structure from among the entangled current carrying structures situated onto a second semiconductor substrate, the second entangled current carrying structure including second entangled current carrying nodes. The first entangled current carrying nodes are electrically interconnected to one another to form a first continuous electrical conductor for carrying an electrical current and first adjacent external magnetic fields from among first external magnetic fields generated by first adjacent entangled current carrying nodes from the first entangled current carrying nodes in response to carrying the current cancel each other. The second entangled current carrying nodes are electrically interconnected to one another to form a second continuous electrical conductor for carrying an electrical current and second adjacent external magnetic fields from among second external magnetic fields generated by second adjacent entangled current carrying nodes from the second entangled current carrying nodes in response to carrying the current cancel each other.

The foregoing Detailed Description further discloses method for forming an entangled inductor structure. The method includes forming a first entangled current carrying structure onto a first semiconductor substrate, the first entangled current carrying structure including first entangled current carrying nodes; forming a second entangled current carrying structure onto a second semiconductor substrate, the second entangled current carrying structure including second entangled current carrying nodes; and connecting the first entangled current carrying structure to the first entangled current carrying structure to form the entangled inductor structure. In this method, a first entangled current carrying node from among the first entangled current carrying nodes is situated adjacent to a second entangled current carrying node from among the first entangled current carrying nodes, the second entangled current carrying node is situated adjacent to a third entangled current carrying node from among the first entangled current carrying nodes, the third entangled current carrying node is situated adjacent to a fourth entangled current carrying node from among the first entangled current carrying nodes, and the fourth entangled current carrying node is situated adjacent to the first entangled current carrying node. Also, in this method, the first entangled current carrying node is electrically connected to the second entangled current carrying node and the third entangled current carrying node, and the second entangled current carrying node is electrically connected to the third entangled current carrying node and the fourth entangled current carrying node.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. An entangled current carrying structure of an entangled inductor structure, the entangled current carrying structure comprising:
 a first entangled current carrying node from among a plurality of entangled current carrying nodes;

a second entangled current carrying node from among the plurality of entangled current carrying nodes;
a third entangled current carrying node from among the plurality of entangled current carrying nodes; and
a fourth entangled current carrying node from among the plurality of entangled current carrying nodes,
wherein the first entangled current carrying node through the fourth entangled current carrying node are electrically interconnected to one another to form a first continuous electrical conductor for carrying an electrical current, and
wherein adjacent external magnetic fields from among a plurality of external magnetic fields generated by adjacent entangled current carrying nodes from among the plurality of entangled current carrying nodes in response to carrying the current are opposite in polarity to each other.

2. The entangled current carrying structure of claim 1, wherein the plurality of entangled current carrying nodes are implemented on a plurality of semiconductor substrates, and
wherein a plurality of through silicon via (TSV) structures within the plurality of semiconductor substrates interconnect the plurality of entangled current carrying nodes.

3. The entangled current carrying structure of claim 1, wherein the plurality of entangled current carrying nodes are implemented as a plurality of open geometric structures.

4. The entangled current carrying structure of claim 3, wherein the plurality of open geometric structures comprise:
a plurality of open rectangular geometric structures.

5. The entangled current carrying structure of claim 1, wherein the first entangled current carrying node is electrically interconnected to the second entangled current carrying node,
wherein the second entangled current carrying node is electrically interconnected to the third entangled current carrying node,
wherein the third entangled current carrying node is electrically interconnected to the fourth entangled current carrying node, and
wherein the fourth entangled current carrying node is electrically interconnected to the first entangled current carrying node.

6. The entangled current carrying structure of claim 1, wherein adjacent internal magnetic fields from among a plurality of internal magnetic fields generated by the adjacent entangled current carrying nodes in response to carrying the current are similar in polarity to each other.

7. The entangled current carrying structure of claim 1, wherein the entangled current carrying structure is mechanically and electrically connected to a second entangled current carrying structure to form the entangled inductor structure.

8. The entangled current carrying structure of claim 1, wherein the adjacent external magnetic fields are opposite in polarity to each other.

9. An entangled inductor structure, comprising:
a first semiconductor substrate having a first entangled current carrying structure from among a plurality of entangled current carrying structures, the first entangled current carrying structure including a first plurality of entangled current carrying nodes; and
a second semiconductor substrate having a second entangled current carrying structure from among the plurality of entangled current carrying structures situated onto a second semiconductor substrate from among the plurality of semiconductor substrates, the second entangled current carrying structure including a second plurality of entangled current carrying nodes,
wherein the first plurality of entangled current carrying nodes are electrically interconnected to one another to form a first continuous electrical conductor for carrying an electrical current, and
wherein the second plurality of entangled current carrying nodes are electrically interconnected to one another to form a second continuous electrical conductor for carrying the electrical current.

10. The entangled inductor structure of claim 9, wherein the first entangled current carrying structure and the second entangled current carrying structure are situated within a first plane and a second plane, respectively, the first plane being parallel to the second plane.

11. The entangled inductor structure of claim 9, wherein first adjacent external magnetic fields from among a first plurality of external magnetic fields generated by first adjacent entangled current carrying nodes from among the first plurality of entangled current carrying nodes in response to carrying the current are opposite in polarity to each other, and
wherein second adjacent external magnetic fields from among a second plurality of external magnetic fields generated by second adjacent entangled current carrying nodes from among the second plurality of entangled current carrying nodes in response to carrying the current are opposite in polarity to each other.

12. The entangled inductor structure of claim 11, wherein the first plurality of entangled current carrying nodes and the second plurality of entangled current carrying nodes are implemented as a first plurality of open geometric rectangular geometric structures and a second plurality of open geometric rectangular geometric structures, respectively.

13. The entangled inductor structure of claim 9, wherein a first entangled current carrying node from among the first plurality of entangled current carrying nodes is electrically interconnected to a second entangled current carrying node from among the first plurality of entangled current carrying nodes,
wherein the second entangled current carrying node is electrically interconnected to a third entangled current carrying node from among the first plurality of entangled current carrying nodes,
wherein the third entangled current carrying node is electrically interconnected to a fourth entangled current carrying node from among the first plurality of entangled current carrying nodes, and
wherein the fourth entangled current carrying node is electrically interconnected to the first entangled current carrying node.

14. The entangled inductor structure of claim 9, wherein first adjacent internal magnetic fields from among a first plurality of internal magnetic fields generated by the first adjacent entangled current carrying nodes in response to carrying the electrical current are similar in polarity to each other, and
wherein second adjacent internal magnetic fields from among a second plurality of internal magnetic fields generated by the second adjacent entangled current carrying nodes in response to carrying the current are similar in polarity to each other.

15. The entangled inductor structure of claim 9, wherein the first semiconductor substrate includes a through silicon via (TSV) structure to mechanically and electrically connect the first entangled current carrying structure and the second entangled current carrying structure.

16. The entangled inductor structure of claim 9, wherein the first adjacent external magnetic fields are opposite in polarity to each other, and
 wherein the second adjacent external magnetic fields are opposite in polarity to each other.

\* \* \* \* \*